United States Patent [19]
Pepi et al.

[11] Patent Number: 5,605,608
[45] Date of Patent: Feb. 25, 1997

[54] DEVICE FOR SPUTTERING A METALLIC MATERIAL ON A PLATE

[75] Inventors: Richard Pepi, Pourrieres; Michel Garcia, Les Milles; Robert Meyer, Saint Nazaire les Eymes, all of France

[73] Assignee: Pixel International S.A., Rousset, France

[21] Appl. No.: 491,446

[22] Filed: Jun. 16, 1995

[51] Int. Cl.⁶ .................................................. C23C 14/34
[52] U.S. Cl. ........................ 204/192.12; 204/192.26; 204/298.11; 204/298.25; 204/298.26
[58] Field of Search ............... 204/192.12, 192.26, 204/298.15, 298.2, 298.11, 298.23, 298.26, 298.25

[56] References Cited

U.S. PATENT DOCUMENTS

| | | | |
|---|---|---|---|
| 4,278,528 | 7/1981 | Kuehnle et al. | 204/298.11 |
| 4,857,161 | 8/1989 | Borel et al. | 204/192.26 |
| 4,981,566 | 1/1991 | Wurczinger | 204/298.26 X |
| 5,084,151 | 1/1992 | Vallana et al. | 204/298.15 X |
| 5,180,476 | 1/1993 | Ishibashi et al. | 204/298.25 X |
| 5,350,498 | 9/1994 | Smith, Jr. et al. | 204/192.26 X |

*Primary Examiner*—Nam Nguyen
*Attorney, Agent, or Firm*—Plevy & Associates

[57] ABSTRACT

A device for sputtering a metallic material on a plate comprises a vacuum chamber provided with a linear conveyor carrying at least one plate, the plate surface to be processed being turned downward. At least two sputtering sources are disposed under the conveyor, perpendicularly to its moving direction. Each source is associated with a collimator. The sputtering sources and their associated collimators are disposed to coat the whole width of the plate.

7 Claims, 3 Drawing Sheets

DEVICE FOR SPUTTERING A METALLIC MATERIAL ON A PLATE

BACKGROUND OF THE INVENTION

1. Field of the Invention

The present invention relates to an installation for sputtering a metallic material on a surface area to be coated. It more particularly applies to the realization of electron emission microtips deposited by vacuum evaporation of a conductive material on the cathode of a flat display screen.

2. Discussion of the Related Art

Microtip screens are mainly constituted by a microtip cathode and a grid that has holes facing the microtips. The cathode faces a catholuminescent anode having a glass substrate that constitutes the display surface.

The operating principle and the detailed structure of such a microtip display are disclosed in U.S. Pat. No. 4,940,916 assigned to Commissariat à l'Energie Atomique.

This device uses the electric field generated between the anode and the cathode so that electrons are extracted from the microtips toward a catholuminescent layer of the anode, subject to the control of the grid.

FIG. 1 is a partial cross-sectional view of the structure of a cathode-grid plate 1 of a microtip screen.

The plate 1 is generally constituted by layers successively deposited on an insulating substrate 2. A conductive layer is deposited over the substrate 2; then, the layer is etched away in a lattice pattern to form cathode conductors 3. A resistive layer 4 is then deposited over the cathode conductors 3. The resistive layer 4 is deposited to protect each microtip 5 against an overcurrent liable to occur at its triggering. An insulating layer 6 is deposited over the resistive layer 4 to insulate the cathode conductors 3 from the grid 7 that is formed by a conductive layer. Holes 8 are provided in layers 6 and 7 to accommodate the microtips.

The deposition of microtips 5 is conventionally carried out by sputtering a conductive material, for example molybdenum. A lift-off layer, for example nickel, is previously formed over the surface of grid 7, and also on the edges of holes 8. The material evaporated at these places, which constitutes the microtips, can thus be eliminated.

A problem encountered in the formation of microtips is that the conventional devices for sputtering a metallic material are not adapted to achieve depositions with a practically normal incidence over large-size plates.

As represented in FIG. 1, the microtips 5 should be deposited at the bottom of holes 8, but the evaporated material should neither fill holes 8, nor be deposited on the walls of the holes in the insulating layer 6. Otherwise, the excessive conductive material could not be eliminated selectively with respect to microtips 5. The lift-off layer that is generally used coats only the surfaces of the grid layer 7. The incidence of the sputtering beam should be practically normal with respect to the plate 1 to prevent deposition outside the desired areas.

Moreover, a screen plate 1 is constituted by a single piece. Hence, the practically normal incidence of the sputtering beam should be obtained over the whole surface of the plate.

FIG. 2 schematically represents a conventional device for evaporating a metallic material such as the one used to form microtips 5.

A metallic material 10 is vacuum evaporated in a crucible 11 containing the material to be deposited. The content of the crucible 11 is heated and sputtered with an electron bombardment device (not shown). Conventionally, a sputtering device comprises a turntable 12 moving in an epicycloidal way. The plates 1 to be coated are suspended on the inner surface of the turntable 12 which is concave towards the crucible 11. A sputtering source, constituted by crucible 11 and the electron bombardment device, is disposed in the middle of turntable 12. The rotation of turntable 12 and plates 1 provides homogenous deposition.

The need for a sputtering beam having a practically normal incidence angle with respect to the plane of plates 1 requires, for large-size plates, the sputtering source to be disposed far away from the plates. This is necessary for the maximum incidence angle $\alpha$ of the sputtering beam which reaches a determined plate to be very small. In other words, the turntable 12 should have an important radius so that the cone of the sputtered material, whose base reaches a determined plate 1, has a very small angle. Typically, the maximum incidence angle of a beam on a determined plate 1 should range from 5° to 15°. For example, for a 20×30-centimeter rectangular plate 1, with a maximum incidence angle of approximately 9°, the distance between the plates 1 and crucible 11 is approximately 1 meter.

Such a distance requires very large-size devices.

Another drawback of the prior art is that the loading and unloading steps of a new series of plates 1 in turntable 12 pollutes the vacuum in which sputtering is achieved, which decreases the production rate of the device.

SUMMARY OF THE INVENTION

An object of the present invention is to avoid the above drawbacks by providing a device which permits sputtering with a substantially normal incidence while remaining compact and having a high production rate.

Another object of the invention is to avoid pollution of the vacuum in which sputtering is achieved so as to allow mass production of the plates.

To achieve these objects, the present invention provides a device for vapor deposition of a metallic material over a plate. The device comprises a vacuum chamber, the upper portion of which comprises a linear conveyor carrying at least one plate, whose surface to be processed is turned downward, and the lower portion of which comprises at least two sputtering sources disposed perpendicularly to the conveying direction. Each source is associated with a collimator collimating the vaporized material beam, the sputtering sources and their associated collimators being disposed so as to coat the whole width of the plate.

According to an embodiment of the invention, the conveyor includes means for maintaining the plate parallel with the conveying direction but tilted according to a determined angle with respect to the horizontal plane. Each sputtering source is associated with a collimator disposed in order to define a sputtering cone whose axis has a determined angle with respect to the surface of the vaporized material.

According to an embodiment of the invention, the collimators are constituted by a mask circularly apertured and disposed between the plate and the sputtering sources.

According to another embodiment of the invention, the vacuum chamber is an airtight vacuum chamber, associated with an input lock chamber and an output lock chamber.

According to another embodiment of the invention, a plate to be coated comprises a pile of layers constituting a cathode and a grid of a flat display screen. The material to be evaporated is a conductive material for constituting the electron emission microtips in holes formed in the grid and a layer insulating the grid from the cathode conductors.

The invention also relates to a method for forming electron emission microtips of a flat display screen. The microtips are deposited through vapor deposition of a conductive material. The method consists of conveying a plate into an airtight vacuum chamber and linearly moving the plate in front of sputtering sources, which are associated with collimators defining a small-angle sputtering cone.

According to a further embodiment of the invention, the angle of the cone defined by each collimator ranges from 5° to 15°.

The foregoing and other objects, features, aspects and advantages of the invention will become apparent from the following detailed description of the present invention when taken in conjunction with the accompanying drawings.

DETAILED DESCRIPTION

For the sake of clarity, the figures are not drawn to scale and the same elements are noted with the same references in the various drawings.

Figure 3:
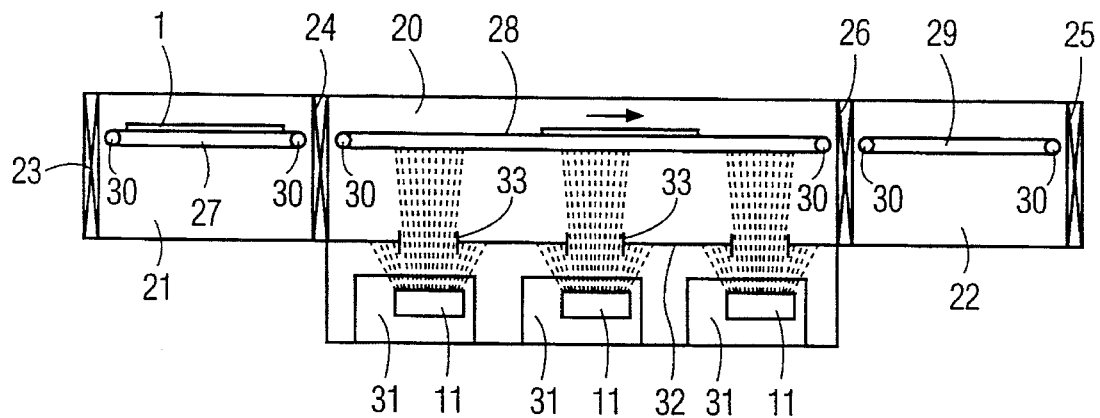
FIG. 3 is a longitudinal cross-sectional view of a first embodiment of a device for sputtering a metallic material according to the present invention.
Figure 4:
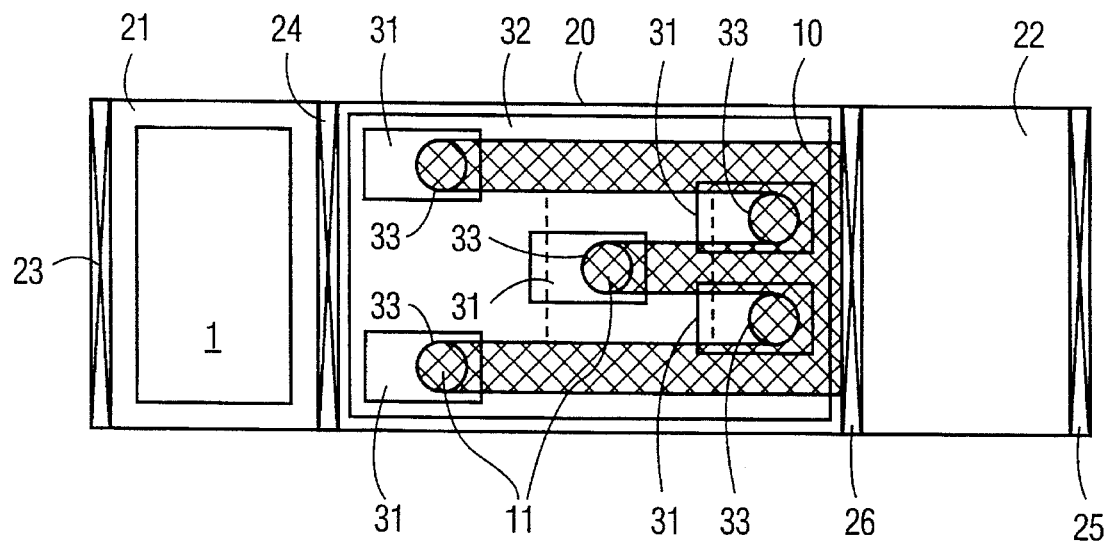
FIG. 4 is a top view of the device of FIG. 3.

As represented in FIGS. 3 and 4, a device according to the invention comprises an airtight chamber 20 constituting a tunnel and ended by an input lock chamber 21 and an output lock chamber 22, respectively. Each lock chamber is closed by doors, 23 and 24, 25 and 26.

A plate 1, introduced through the lock chamber 21, is conveyed toward the vacuum chamber 20 by a conveyor 27. The conveyor 27 is preferably in alignment with a conveyor 28 in the upper portion of chamber 20. At the output, a conveyor 29 of the lock chamber 22 is in alignment with the conveyor 28 of chamber 20. The path of conveyor 28 in the vacuum chamber is linear and horizontal at least in a sputtering area. Preferably, the path of conveyor 28 is linear and horizontal throughout chamber 20 from the input lock chamber 21 to the output lock chamber 22.

Conveyors 27, 28, and 29 are, for example formed by two separated parallel strips, driven by rollers 30. Plates 1 are conveyed, with their surface to be coated facing downside, so as to rest by two edges on the conveyor strips. Aerial conveyors can also be used. Aerial conveyors are constituted by rails from which sledges are suspended, whose skates constitute supports for two edges of plates 1. Plates 1 could also be suspended to aerial conveyors by clips for gripping the plate edges.

Sputtering sources 31 are disposed in the lower part of chamber 20. These sputtering sources are constituted by crucibles 11 containing the material to be sputtered and electron bombardment devices (not shown). Sources 31 are preferably distributed in the processing area so that the whole surface of plate 1 is coated during its passage through chamber 20. In other words, chamber 20 includes several sputtering sources 31 disposed perpendicularly with respect to the axis of the conveyor of plates 1, each sputtering source 31 covering a determined portion of the width of chamber 20.

Each sputtering source 31 is associated with a collimator limiting the beam of sputtered material emitted by the source. The collimator is disposed between the crucible 11 of the sputtering source and the surface to be coated of plate 1. The collimators are, for example, constituted by a mask 32 disposed between the crucibles 11 and the surface to be coated of plate 1. Mask 32 is, for example, formed by a plate circularly apertured in front of each crucible 11.

The diameter of each aperture 33 of mask 32 depends upon the range of the desired incidence angles for the sputtering of material 10, and upon the distance separating the crucibles from mask 32.

As represented in FIGS. 3 and 4, the sputtering sources 31 are distributed along the vacuum chamber 20. The sources could also be aligned along a direction perpendicular to the conveyor axis. However, care should be taken so that the areas, covered by the base of the sputtering cones on plate 1 and defined by apertures 33, cover the whole width of plate 1. Also, care should be taken so that the base of the sputtering cones of the two sources 31, having adjacent coating areas, suitably overlap each other in order to not impair the evenness of the deposition.

Thus, the invention achieves the sputtering of the material practically orthogonally to the surface to be coated while decreasing the distance separating plates 1 from the sputtering sources. This decrease in the distance is obtained by the increase in the number of sputtering sources associated with a same plate. This increased number of sources decreases the base surface of each sputtering cone and accordingly makes it possible to decrease the distance between the plates and the crucibles 11.

Moreover, the distance between plates 1 and a determined number of crucibles 11 is determined as a function of the small size and no longer as a function of the large size of a rectangular plate.

In addition, using a mask 32 apertured only in front of the crucibles 11 and whose apertures 33 are formed as a function of the size of the plates, prevents the material from scattering in the chamber 20 by limiting the sputtering directions to the useful directions.

Figure 1:
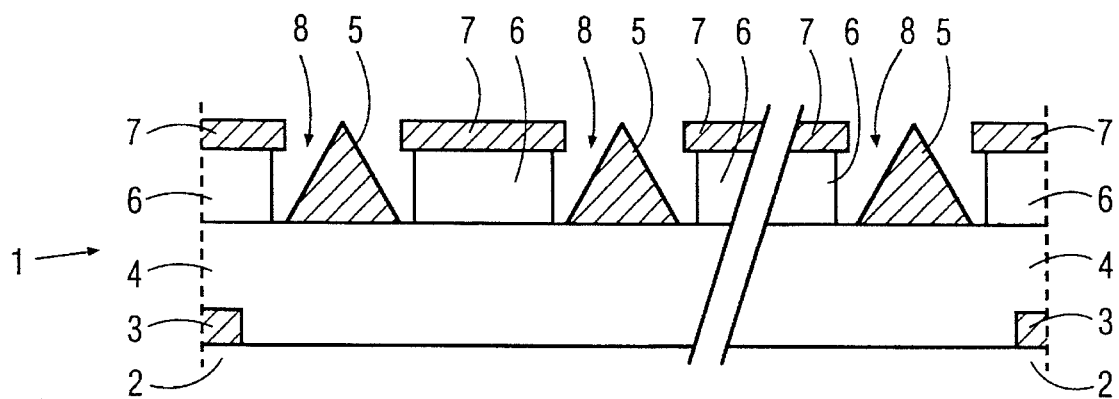
FIGS. 1 and 2, above described, illustrate the state of the art and the problem encountered.
Figure 2:
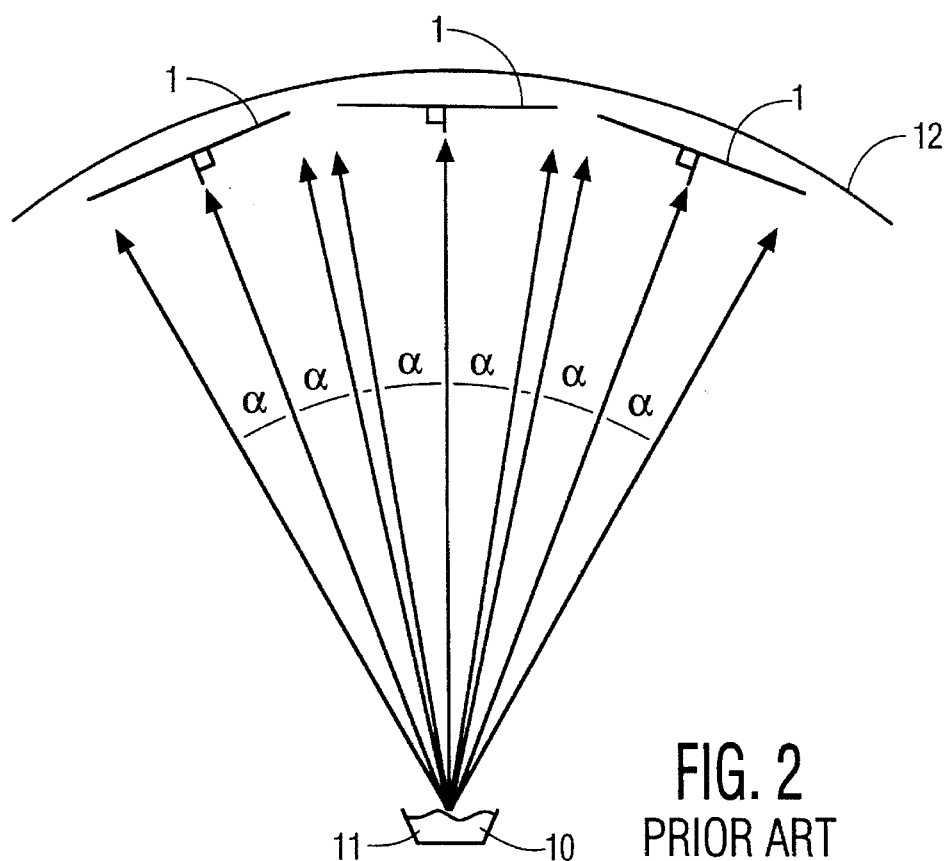

Referring back to the example disclosed with relation to FIG. 2, plate 1 can be placed at only approximately 13 centimeters from the five crucibles 11 whose sputtering cones have a base diameter of 4 centimeters. Such sputtering cones can, for example, be obtained with a mask 32 having circular apertures 33 with a diameter of approximately 2 centimeters disposed at approximately 6 centimeters from crucibles 11. Since a determined plate 1 receives sputtered material provided by five crucibles 11, each of which is assigned to a portion of the plate surface, the deposition speed increases by a ratio 5 with respect to the example of FIG. 2.

Figure 5:
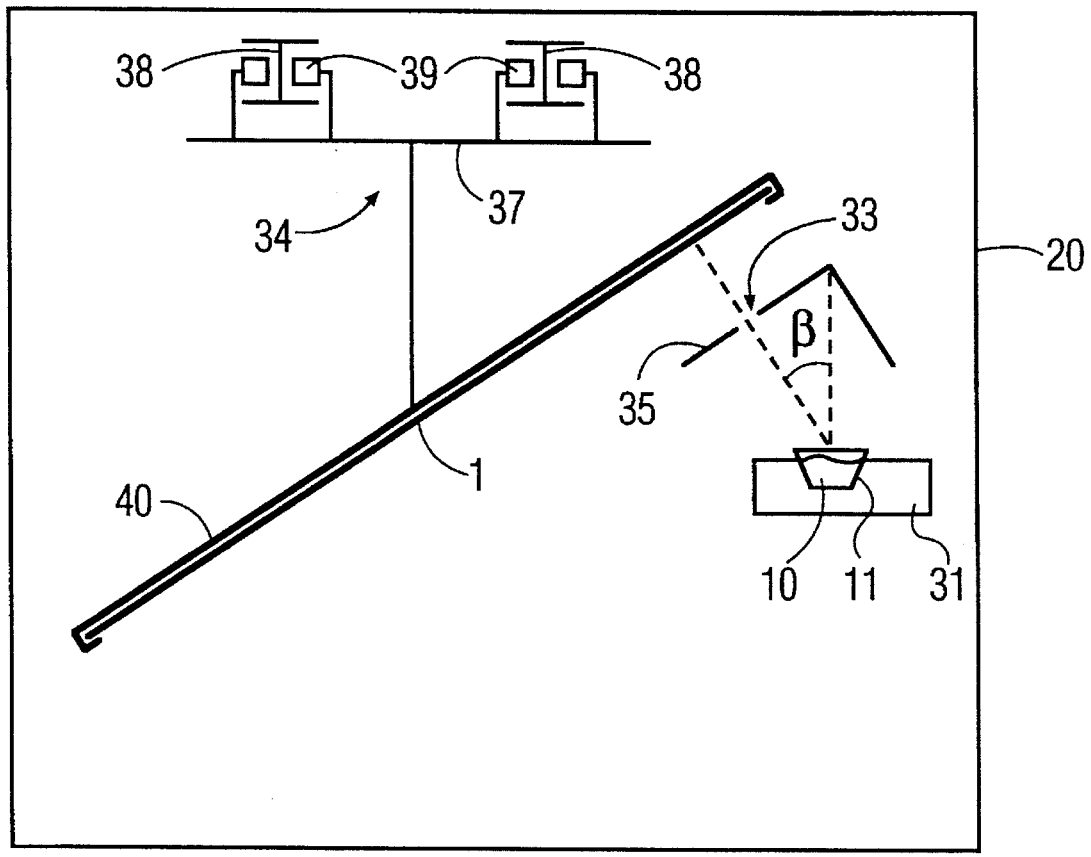
FIG. 5 is a cross-sectional view of a second embodiment of a sputtering device according to the present invention.

FIG. 5 illustrates another embodiment of a device according to the invention.

In this embodiment, plates 1 are still linearly conveyed into chamber 20 by a conveyor 34, but they are tilted according to a determined angle with respect to the horizontal plane.

Each sputtering source 31 is associated with a collimator 35 which defines a sputtering cone in a direction having an angle β with respect to the normal to the surface of the material 10 contained in crucible 11. The cone defined by each collimator 35 is directed towards plate 1. Each collimator 35 is, for example, as previously formed by a plate comprising a circular aperture 33 defining the sputtering cone. Preferably, each plate constituting a collimator 35 covers a crucible 11 with which it is associated to prevent the material from unduly scattering in chamber 20.

The sputtering sources 31 are still distributed perpendicularly to the conveyor direction, but also at different heights so that the distance between plate 1 and each crucible 11 is constant. For the sake of clarity, only one sputtering source 31 is represented in FIG. 5. In practice, several sources should be provided so that each sputtering cone corresponds to a strip of plate 1, making it possible, as previously, to dispose the plates at a short distance from crucibles 11.

Preferably, when the plates 1 are tilted, an aerial conveyor is used. The conveyor 34 is, for example, constituted by beams 37 suspended to two parallel rails 38 through conveyor rollers 39. Plates 1 are suspended to the beams by supporting grips 40.

Such an embodiment avoids material eruptions, which may occur mainly along the normal to the surface of the material contained in the crucible, to reach the plates, which would render them inoperative.

As is apparent to those skilled in the art, various modifications can be made to the above disclosed preferred embodiments. More particularly, each of the described devices can be replaced with one or more elements fulfilling the same functions. For example, the conveyors could be formed by any appropriate means provided that they linearly convey the plates in a horizontal direction and that the downside surface of the plates is accessible.

In addition, the selection of the respective sizes of the apertures of the collimators and of the distance between the collimators and the sputtering sources depends upon the desired incidence angle for the sputtered material, the size of the plates to process, and the distance between the plates and the sputtering sources.

We claim:

1. A device for sputtering a metallic material on an entire surface of a plate comprising:

a vacuum chamber (20), a linear conveyor (28; 34) carrying at least one plate (1) having a surface to be processed, said surface to be processed being turned downward, at least two sputtering sources (31) containing material to be vaporized (10) disposed under the conveyor, perpendicularly to its moving direction; and a collimator (32, 33; 35) associated with each source, the sputtering sources and their associated collimators being arranged to coat the whole width of the plate (1) under a substantially normal incidence.

2. The device of claim 1, wherein said conveyor (34) includes means for maintaining the plate (1) parallel with the conveying direction, the plate being tilted according to a predetermined angle with respect to the horizontal plane, and wherein each sputtering source (31) is associated with a collimator (35) that is disposed in order to define a sputtering cone whose axis has a predetermined angle ($\beta$) with respect to a surface of the material to be vaporized.

3. The device of claim 1, wherein said collimators are constituted by a mask (32) circularly apertured and disposed between the plate (1) and said sputtering sources (31).

4. The device of claim 1, wherein said vacuum chamber (20) is an airtight chamber, ended by an input lock chamber (21) and an output lock chamber (22).

5. The device of claim 1, wherein said plate (1) to be coated comprises a pile of layers (2, 3, 4, 5, 6, 7) constituting a cathode and a grid of a flat display screen, wherein one of said layers comprises cathode conductors, and wherein said material to be vaporized is a conductive material for constituting electron emission microtips (5) in holes (8) formed in the grid (7) and a layer (6) for insulating the grid from the cathode conductors (3).

6. A method for forming electron emission microtips of a flat display screen, the microtips being deposited through vaporization of a conductive material on a cathode, said method comprising the steps of:

conveying a plate (1) into an airtight vacuum chamber (20); and linearly moving the plate in front of at least two sputtering sources (31) of said material, arranged perpendicularly to the moving direction, each source being associated with a collimator (32, 33; 35) defining a small-angle sputtering cone, the sources and the associated collimators being arranged so as to process the whole surface of the plate.

7. The method of claim 6, wherein the angle of the cone defined by each collimator (32,33;35) ranges from 5° to 15°.

* * * * *